US007092284B2

(12) United States Patent
Braun et al.

(10) Patent No.: US 7,092,284 B2
(45) Date of Patent: Aug. 15, 2006

(54) MRAM WITH MAGNETIC VIA FOR STORAGE OF INFORMATION AND FIELD SENSOR

(75) Inventors: Daniel Braun, Paris (FR); Rainer Leuschner, Samoreau (FR); Ulrich Klostermann, Fontainebleau (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 4 days.

(21) Appl. No.: 10/922,434

(22) Filed: Aug. 20, 2004

(65) Prior Publication Data

US 2006/0039185 A1 Feb. 23, 2006

(51) Int. Cl.
*G11C 11/14* (2006.01)

(52) U.S. Cl. .................. 365/158; 365/171; 365/173
(58) Field of Classification Search ............. 365/158, 365/171, 173, 55, 66
See application file for complete search history.

(56) References Cited

U.S. PATENT DOCUMENTS 6,545,906 B1   4/2003  Savtchenko et al. ........ 365/158
6,664,579 B1 * 12/2003 Kim et al. .................. 257/296
6,870,760 B1 *  3/2005 Tsang ......................... 365/158
6,909,129 B1 *  6/2005 Kim et al. .................. 257/295
6,909,630 B1 *  6/2005 Tsang ......................... 365/158
6,909,633 B1 *  6/2005 Tsang ......................... 365/173

* cited by examiner

*Primary Examiner*—Tan T. Nguyen
(74) *Attorney, Agent, or Firm*—Dicke, Billig & Czaja, PLLC

(57) ABSTRACT

A magnetic memory element is disclosed. The magnetic memory element includes a magnetic via for storing information, made of a magnetic material and being vertically oriented relative to a wafer surface on which the magnetic memory element is formed, the magnetic via having a magnetic anisotropy with its magnetization vector being magnetically coupled to at least one current line, and a magnetic sensor element comprising at least one magnetic layer having a magnetization vector being magnetically coupled to the magnetization vector of the magnetic via, wherein the magnetic sensor element being conductively connected to said at least one current line.

22 Claims, 4 Drawing Sheets

MRAM WITH MAGNETIC VIA FOR STORAGE OF INFORMATION AND FIELD SENSOR

CROSS-REFERENCE TO RELATED APPLICATIONS

This Patent Application is also related to Utility patent application Ser. No. 10/923,651, filed on even date herewith, entitled "MRAM With Vertical Storage Element and Field Sensor;" Utility patent application Ser. No. 10/923,639, filed on even date herewith, entitled "MRAM With Vertical Storage Element in Two Layer-Arrangement and Field Sensor;" and is commonly assigned to the same assignee as the present invention, and which is herein incorporated by reference.

FIELD OF THE INVENTION

This invention relates to non-volatile semiconductor memory devices, and more particularly, relates to magnetic memory elements and a magnetic random access memory (MRAM) device comprising said memory elements for use in a semiconductor integrated circuit

BACKGROUND

Magnetic (or magneto-resistive) random access memory (MRAM) is a non-volatile access memory technology that could potentially replace the dynamic random access memory (DRAM) as the standard memory for computing devices. Particularly, the use of MRAM-devices as a non-volatile RAM will eventually allow for "instant on"-systems that come to life as soon as the computer system is turned on, thus saving the amount of time needed for a conventional computer to transfer boot data from a hard disk drive to volatile DRAM during system power up.

A magnetic memory element (also referred to as a tunneling magneto-resistive or TMR-device) includes a structure having ferromagnetic layers separated by a non-magnetic layer (barrier) and arranged into a magnetic tunnel junction (MTJ). Digital information is stored and represented in the magnetic memory element as directions of magnetization vectors in the ferromagnetic layers. More specifically, the magnetic moment of one ferromagnetic layer is magnetically fixed or pinned (also referred to as a "reference layer"), while the magnetic moment of the other ferromagnetic layer (also referred to as "free layer") is free to be switched between the same and opposite directions with respect to the fixed magnetization direction of the reference layer. The orientations of the magnetic moment of the free layer are also known as "parallel" and "anti-parallel" states, respectively, wherein a parallel state refers to the same magnetic alignment of the free and reference layers, while an anti-parallel state refers to opposing magnetic alignments therebetween.

Depending upon the magnetic states of the free layer (i.e., parallel or anti-parallel states), the magnetic memory element exhibits two different resistance values in response to a voltage applied across the magnetic tunnel junction barrier. The particular resistance of the TMR-device thus reflects the magnetization state of the free layer, wherein resistance is "low" when the magnetization is parallel, and "high" when the magnetization is anti-parallel. Accordingly, a detection of changes in resistance allows a MRAM-device to provide information stored in the magnetic memory element, that is to say to read information from the magnetic memory element. In addition, a magnetic memory element is written to through the application of a bi-directional current in a particular direction, in order to magnetically align the free layer in a parallel or anti-parallel state.

A MRAM-device integrates a plurality of magnetic memory elements and other circuits, such as a control circuit for magnetic memory elements, comparators for detecting states in a magnetic memory element, input/output circuits and miscellaneous support circuitry. As such, there are certain microfabrication processing difficulties to be overcome before high capacity/density MRAM-devices become commercially available. For example, in order to reduce the power consumption of the MRAM-device and provide a variety of support functions CMOS-technology is used. Various CMOS processing steps are carried out at relatively high temperatures, while ferromagnetic materials employed in the fabrication of MRAM-devices require substantially lower process temperatures. Thus, the magnetic memory elements are designed to be integrated into the back end wiring structure of back-end-of-line (BEOL) CMOS processing following front-end-of-line (FEOL) CMOS processing.

To be useful in present day electronic devices, very high density arrays of magnetic memory cells are utilized in magnetic random access memories. In these high density arrays the magnetic cells are generally arranged in rows and columns, with individual cells being addressable for reading and writing operations by the selection of an appropriate row and column containing the desired cell. Also, conveniently orthogonal current lines are provided, one for each row and one for each column so that a selected cell is written by applying current to the appropriate row current line and the appropriate column current line.

Recently, and especially in view of portable equipment, such as portable computers, digital still cameras and the like, the demand of low-cost and particularly high-density mass storage memories has increased dramatically. Therefore, one of the most important issues for low-cost and high-density MRAM-devices is a reduction of the MRAM-cell size. However, down-scaling MRAM-cells requires smaller and smaller magnetic tunnel junctions and, therefore, a lot of severe problems arise, since for a given aspect ratio and free, layer thickness the activation energy being dependent on the free layer volume scales down like w, where w is the width of the magnetic cell. Otherwise, the switching fields increase roughly like 1/w. Thus, in scaling down MRAM-cells field selected switching becomes ever harder, but at the same time the magnetic cell loses its information more and more rapidly due to thermal activation.

In light of the above, there is a need to provide a magnetic memory element and magnetic random access memory (MRAM) device comprising such magnetic memory elements enabling a cell-size down-scale without thereby causing severe problems as to an increase of switching-fields and decrease of activation energy.

SUMMARY

The present invention provides a magnetic memory element, and a magnetic random access memory including one or more memory elements. In one embodiment, the magnetic memory element includes a magnetic via for storing information made of a magnetic material and being vertically oriented relative to a wafer surface on which the magnetic memory element is formed, said magnetic via having a magnetic anisotropy with its magnetization vector being magnetically coupled to at least one current line, and a magnetic sensor element comprising at least one magnetic layer having a magnetization vector being magnetically coupled to said magnetization vector of said magnetic via, wherein said magnetic sensor element being conductively connected to said at least one current line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
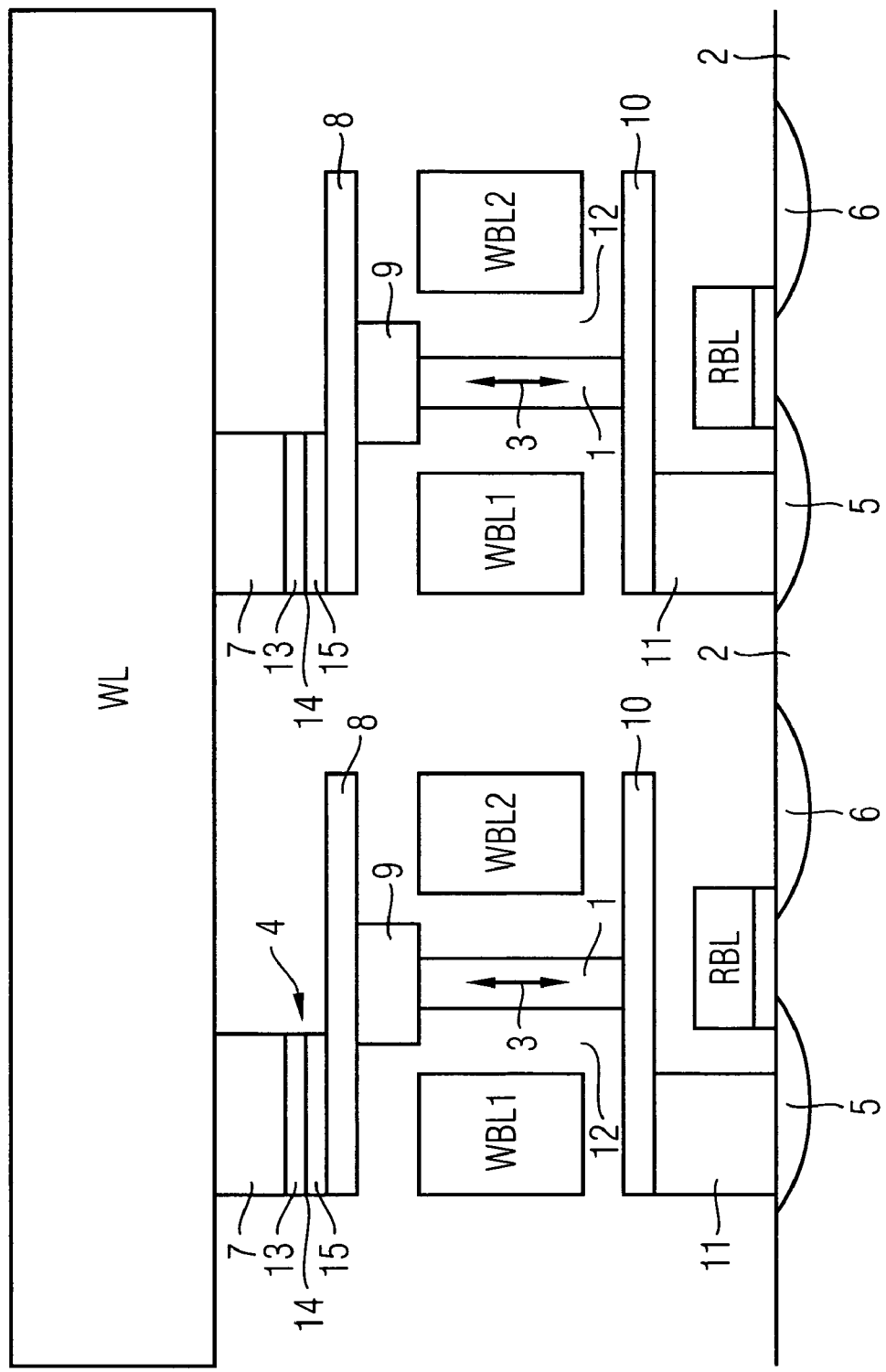
FIG. 1A is a schematic diagram of a vertical cross-sectional view sectioned along a word line illustrating a first embodiment of a magnetic memory element of the invention.
Figure 1B:
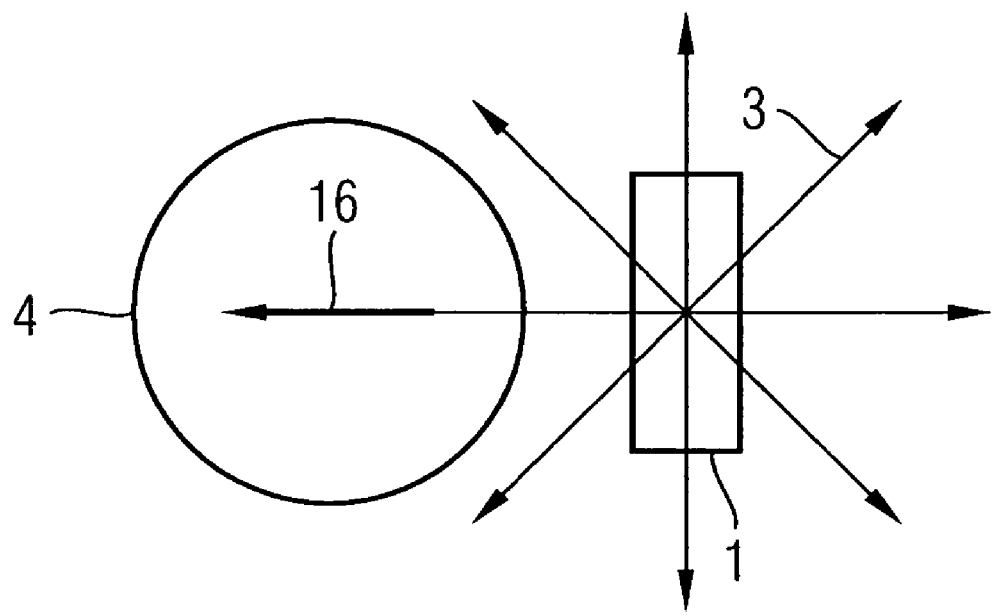
FIG. 1B is a schematic diagram of a top view illustrating stray fields from the magnetic via and its sensing by the magnetic sensor element of the embodiment shown in FIG. 1A.

FIGS. 1A and 1B illustrate one embodiment of a magnetic memory element of the invention. Referring to FIGS. 1A and 1B, in which FIG. 1A is a schematic, vertically cut, cross-sectional view sectioned along the word line (WL), one embodiment of the magnetic memory element of the invention is explained.

Based on a FET memory cell with liner along the WL, the magnetic memory element of the invention comprises a magnetic via 1 made up of a ferromagnetic, conductive material arranged in between a split write bit line comprised of a first write bit line (WBL1) and a second write bit line (WBL2). The magnetic via is in a vertical orientation relative to the surface of a wafer 2 on which the magnetic memory element is formed, and, is provided with magnetic shape anisotropy, by appropriately choosing its aspect ratio, such that its height, i.e., dimension in a direction perpendicular to the wafer 2 surface, is slightly larger than its width, i.e., dimension in a direction parallel to the wafer 2 surface, and is chosen to be in the range of 2 to 3, and especially amounts to approximately 2. The shape anisotropy of magnetic via 1 thus is perpendicularly oriented to the wafer 2 surface. Particularly, the split two parts (WBL1, WBL2) of said second current line are spaced apart from each other to have a distance which is less equal to or less than a minimum lithographic feature size F, to appropriately select an aspect ratio (shape anisotropy) of magnetic via 1. As result, magnetization vector 3 magnetic via 1 may be switched between the two directions perpendicularly aligned to the wafer 2 surface in response to external magnetic fields coupled therewith.

The magnetic via 1, more precisely its magnetization vector 3 is magnetically coupled to the magnetic fields of WBL1 and WBL2, and, the word line (WL) arranged on top of it. Since two currents in opposite directions are sent through WBL1 and WBL2, both WBL1 and WBL2 create magnetic fields in the plane of the magnetic via 1, which point in the same direction at the position of the magnetic via 1, while the WL creates a magnetic field perpendicular to the plane of the magnetic via 1. For switching typically the Stoner-Wohlfahrt switching scenario may be used, which is well-known to those skilled in the art and therefore need not be explained in further details here.

The magnetic memory element further comprises a horizontal magnetic sensor element 4 as magnetic field sensor being arranged separately from the magnetic via for sensing information stored in the magnetic via. It is conductively interposed between WL and a selection device formed in the wafer 2 way and realized as FET-transistor, which comprises drain 5 and source 6. For electrical interconnection between WL and drain 5, a series connection is comprised of, in that order, a non-magnetic, electrical conductive via 7 connected to the WL, which for example is made of TaN, the magnetic sensor element 4 itself, a non-magnetic, electrical conductive layer 8, which for example is made of TaN, a non-magnetic, electrical conductive via 9, which for example is made of TaN, the conductive magnetic via 1 itself, a non-magnetic, electrical conductive layer 10, which for example is made of TaN, and a non-magnetic, electrical conductive via 11 connected to the drain 5. In order to be electrically isolated from split bit lines WBL1 and WBL2, respectively, non-magnetic, electrical conductive via 7, magnetic sensor element 4, non-magnetic, electrical conductive layer 8, non-magnetic, electrical conductive via 9, conductive magnetic via 1, non-magnetic, electrical conductive layer 10, and non-magnetic, electrical conductive via 11 are embedded in a non-magnetic, electrically isolating material 12.

The magnetic sensor element is realized as a magnetic tunnel junction (MTJ) having a aspect ratio of about 1, which comprises two ferromagnetic layers 13 and 15 of magnetic material stacked in parallel, overlying relationship and are separated by a layer of nonmagnetic material 14. While its ferromagnetic layer 15 is designed to be a reference layer, the magnetic moment of which being pinned, ferromagnetic layer 13 is designed to be a free layer, the magnetic moment of which being free to be switched between the same and opposite directions with respect to the pinned magnetization direction of the reference layer. The orientation of the magnetic moment of the free layer thus may be switched between its parallel and anti-parallel states, in response to the magnetic stray field of the magnetic via 1 which is seen by the MTJ. Due to an aspect ratio of about 1, the magnetic moment of the free layer 13 can be switched between its parallel and anti-parallel states according to stray fields associated with different orientations of magnetization vectors of the magnetic via 1.

Since the MTJ 4 exhibits two different resistance values in response to a voltage applied across the MTJ-barrier, information stored in the magnetic via 1 may be read out by a sense current, which flows between the WL and the selection device. For reading out parallel and anti-parallel states of the MTJ, a read bit line (RBL) is provided.

In the first embodiment of the invention illustrated in FIG. 1A, the MTJ 4 is positioned to be horizontally shifted as to the magnetic via 1.

With reference to FIG. 1B, stray fields from the magnetic via 1 and its sensing by the MTJ 4 is illustrated. As can be seen from FIG. 1B, left diagram, in case magnetization vector 3 of magnetic via 1 is oriented in a direction away from the wafer 2 surface, the stray field seen by the MTJ 4 results in a left-ward orientation of the magnetization vector 16 of the free layer 13 of MTJ 4, while in the other case, see FIG. 1B, right diagram, where the magnetization vector 3 of magnetic via 1 is oriented in a direction towards the wafer 2 surface, the stray field seen by the MTJ 4 results in a right-ward orientation of the magnetization vector 16 of the free layer 13 of MTJ 4. Switching magnetization vector 3 of magnetic via 1 thus results in switching magnetization vector 16 of the free layer 13 of MTJ 4.

Figure 2:
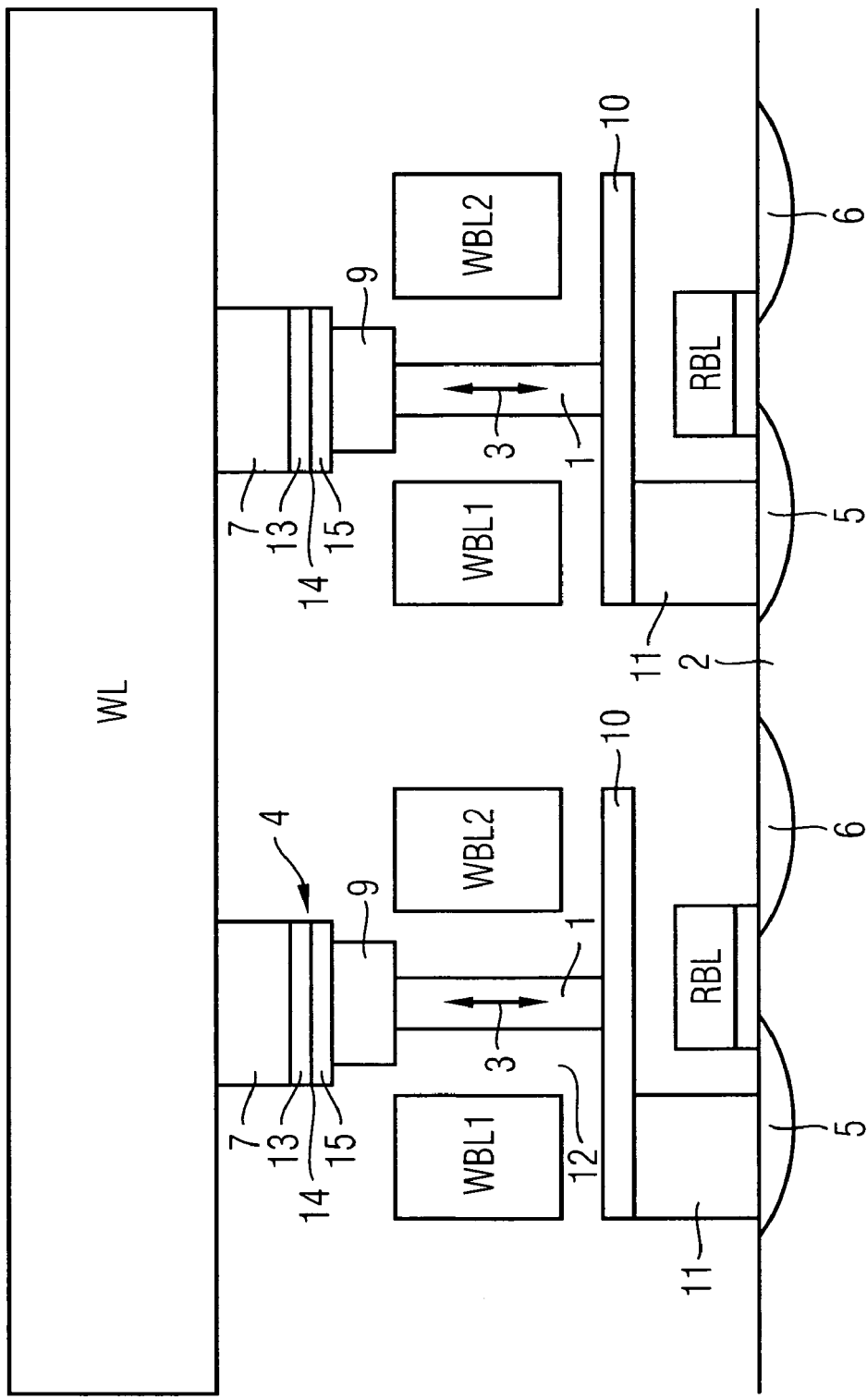
FIG. 2 is a schematic diagram of a vertical cross-sectional view sectioned along the word line illustrating another embodiment of a magnetic memory element of the invention.

Referring to FIG. 2, a second embodiment of the magnetic memory element of the invention is explained. In order to avoid unnecessary repetitions only the differences to the above-described first embodiment will be explained, while otherwise reference is made to the explanations made relating to the first embodiment.

Figure 1B:
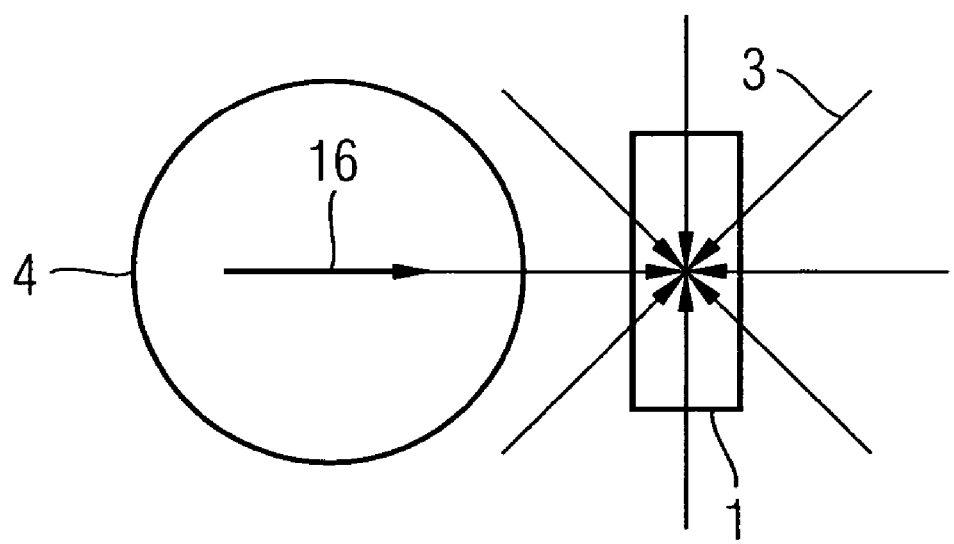

As illustrated in FIG. 2, contrary to the embodiment of FIG. 1, in the embodiment of the magnetic memory element according to FIG. 2, the MTJ 4 is positioned to be in a stacked relationship as to the magnetic via 1, that is to say is positioned in vertical direction above the magnetic via 1. For electrical interconnection between WL and drain 5, in avoiding conductive layer 8, an electrical series connection thus is comprised of, non-magnetic, electrical conductive via 7 connected to the WL, magnetic sensor element 4 itself, non-magnetic, electrical conductive via 9, conductive magnetic via 1 itself, non-magnetic, electrical conductive layer 10, and non-magnetic, electrical conductive via 11 connected to the drain 5. The second embodiment of the invention is advantageous in that the MTJ 4 can be placed very close to the magnetic via 1, so that very large magnetic stray fields seen by the MTJ 4 can be created.

Figure 3:
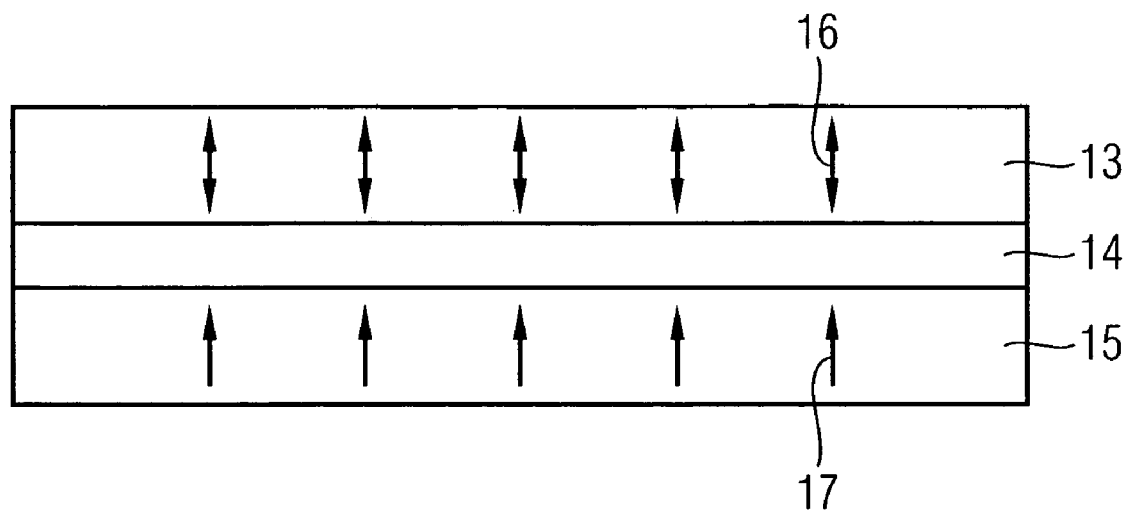
FIG. 3 is a schematic diagram of a vertical cross-sectional view illustrating a magnetic tunneling junction having the magnetization of its free and fixed layers perpendicularly oriented to the wafer surface.

FIG. 3 illustrates a magnetic tunneling junction 4, for use in the present invention, in which the magnetization vector 16 of its free layer 13 and the magnetization vector 17 of its fixed layer 15 is perpendicularly oriented to the free and reference layers surface, and thus is perpendicularly oriented to the wafer 2 surface in case MTJ 4 is horizontal to the wafer 2 surface. Both free and reference layers 13, 15, may be made of thin Ni-films.

According to one embodiment of the invention, magnetic memory element 1, comprises a magnetic storage element for storing information designed as magnetic via 1 and a magnetic sensor element 4 for sensing the magnetization of the magnetic via 1, which may be provided spatially distanced from the magnetic via 1, or alternatively be in contact therewith, and at least one current line, typically a number of three, which may be identified by a bit line, a write word line and read word line, respectively. Here, the term "magnetic via" denotes a via filled with (ferro-) magnetic material, such as Ni, Fe, Co and their alloys. As in the convenient case of MRAM-cells, the magnetic memory element of the present invention is formed on a wafer surface.

The magnetic via 1 is magnetically coupled to the at least one current line, and in a typical and preferable arrangement of the invention is magnetically coupled to two current lines, which may be identified by a write bit line and a word line, respectively. The magnetization vector of the magnetic via 1 is preferably oriented substantially perpendicular relative to the wafer surface. For magnetically coupling the magnetization vector of the magnetic via 1 to the at least one current line, the former is preferably positioned adjacent or at least close to said at least one current line, which typically and preferably may be identified by a (write) bit line (WBL). It is highly preferred if the magnetic memory element of the invention comprises a first current line, which may be identified by a word line (WL) and a second current line, which may be identified by a write bit line (WBL), both of which preferably are perpendicularly aligned, i.e., crossing at right angles, as in the convenient case, wherein at the same time the second current line is split into two parts, which may be identified as first and a second write bit lines (WBL1, WBL2), while the magnetic via is positioned in between the split two parts (WBL1, WBL2) of the second current line. Such split-division of the second current line advantageously allows for a doubling of magnetic fields seen from the magnetic via for the purpose of its switching.

Both parts of the second current line (WBL1, WBL2) preferably have a distance from each other which at most amounts to the minimum lithographic feature size F, that is to say, the minimum feature size to be achieved by photolithographic (UV) methods, which presently amounts to about 90 nm.

In order to switch the magnetic via 1, two currents in opposite directions are sent through the two parts of the second current line, while a perpendicular current is sent through the first current line. Then, the magnetic fields from the two parts of the second current line point in the same direction at the position of the magnetic via (either both up or both down) and switch the magnetic via 1, if at the same time the first current line is selected and produces a magnetic field perpendicular to the magnetic via 1. Insofar, a field select concept may be used, which is the same as in MRAM-devices.

The magnetic via 1 of the invention is made of a (ferro-) magnetic material and is vertically oriented relative to the wafer surface on which the magnetic memory element is formed. The magnetic via 1 is provided with magnetic anisotropy, which may be conveniently affected by appropriately choosing its aspect ratio and/or by intrinsic anisotropy, as is known to those skilled in the art. Particularly, the height of the magnetic via 1 may be chosen to be slightly larger than its width so as to give the magnetic via a finite aspect ratio in vertical direction and thus shape anisotropy with a preferred direction perpendicular to the wafer surface.

Digital information stored in the magnetic via 1 is read out by a magnetic sensor element 4 that senses the magnetization of the at least one magnetic layer of the magnetic storage element. To this aim, the magnetic sensor element 4 of the magnetic memory element of the invention comprises at least one magnetic layer, made of a magnetic material, the magnetization vector of which being magnetically coupled to the magnetization vector of the magnetic via 1. Magnetic coupling between the at least one magnetic layer of the magnetic via 1 and the magnetic sensor element 4 may be realized via a magnetic stray field of the magnetic via 1 seen by the magnetic sensor element 4. In that case, in order to provide for sufficient magnetic coupling between magnetic storage and magnetic sensor elements, the magnetic sensor element 4 has to be positioned within the magnetic stray field of the magnetic via 1, such that the magnetization vector of the magnetic layer of the magnetic sensor element 4 may be sufficiently influenced, and particularly is able to follow the magnetization vector of the magnetic via 1. To this aim, the magnetic sensor element 4 typically is placed in the vicinity of the magnetic via 1. Alternatively, magnetic coupling between the magnetic via 1 and the magnetic sensor element 4 may also be realized via magnetic exchange coupling, in which case the magnetic via 1 and the magnetic sensor element 4 are brought into contact.

The magnetic sensor element 4 of the magnetic memory element of the invention is conductively connected to the at least one current line. Particularly, it may be conductively connected to an active structure, that is to say a selection device of the wafer, like a FET-transistor, diode and the like. Alternatively, in realizing a "cross-point-architecture", it may also be conductively connected to two current lines, wherein the first one of which may typically be identified as bit line, while the other one may typically be identified as word line.

The magnetic sensor element 4 preferably is realized as a magnetic tunnel junction, which comprises two magnetic layers made of magnetic material stacked in parallel, overlying relationship and are separated by a layer of nonmagnetic material.

In the magnetic memory element of the invention the magnetic layer of the magnetic sensor element 4 is substantially parallel to the wafer surface, that is to say the magnetic layer oriented in that plane is horizontally aligned.

According to a preferred realization of the magnetic memory element of the present invention, the magnetic sensor element 4 is conductively interposed between said at least one current line and a selection device in using said magnetic via 1 being made of a conductive material as a part of an electrical series connection between said at least one current line and said selection device. In other words, an electrical series connection comprising the at least one current line, the magnetic sensor element 4, the magnetic via 1 and the selection device is established.

Alternatively, in a typical "cross-point-architecture", the magnetic sensor element 4 of the magnetic memory element of the invention may be conductively interposed between two current lines, which may be identified as bit line and word line, respectively, In other words, an electrical series connection comprising the word line, the magnetic sensor element 4, the magnetic via 1 and the bit line is established.

The magnetic sensor element 4 of the invention can have an arbitrarily chosen shape, for instance circle, round, square with rounded edges and the like.

The magnetic sensor element 4 preferably is realized as a magnetic tunnel junction (MTJ), which comprises two magnetic layers of magnetic material stacked in parallel, overlying relationship and are separated by a layer of nonmagnetic material. In the magnetic memory element of the invention the magnetic sensor element 4, particularly in form of an MTJ, preferably is arranged to be substantially parallel to the wafer surface. In that case it might be highly advantageous to provide for a magnetization of the MTJ, in which both free and reference layers have a magnetization perpendicular to the wafer surface (while the MTJ itself is still parallel to the wafer surface). Such a MTJ can be realized for example with thin Ni-layers (films), as in Ni-films the magnetization naturally points perpendicular to the film surface, as long as the films are sufficiently thin. In fact, a thickness should be chosen where the magnetization is still aligned perpendicular to the film surface, but the phase with in-plane magnetization should be rather close, so that the magnetization can be easily switched from one (especially perpendicular) direction into the opposite one in response to the magnetization of the magnetic via. Such MTJ provided with free and reference layers having a magnetization perpendicular to the wafer surface may advantageously be used for memory elements with highly reduced total size.

In one preferred embodiment of the invention, the magnetic via 1 and the magnetic sensor element 4 are arranged in a vertically stacked relationship. Alternatively, in another preferred embodiment of the invention, the magnetic via 1 is horizontally shifted against the magnetic sensor element 4.

In one embodiment of the present invention an aspect ratio of the magnetic storage via preferably is chosen to be larger than 1, and may particularly be in the range of from 1.5 to 3 in order to provide for a sufficiently high magnetic shape anisotropy.

In general, in order to provide for a sufficiently precise sensing of the magnetization of the magnetic via 1, the magnetic anisotropy of the magnetic layer of the magnetic sensor element 4 is chosen to be smaller than that one of the magnetic via. While, basically, shape anisotropy may be combined with intrinsic anistropy, i.e., shape anisotropy may be (partially) compensated or added by intrinsic anisotropy, it is clear that it is the resulting total magnetic anisotropy that has to be chosen to be smaller than that one of the magnetic via. To this aim, it may be preferable to choose an aspect ratio of the magnetic sensor element 4, which is in the range of from 1 to 2, and more preferably amounts to approximately 1.

Scaling down the magnetic memory element of the present invention, the magnetic memory element may be realized in about 8 $F^2$ structure size. Otherwise, independently from the size of the magnetic memory element as such, the magnetic sensor element 4 may preferably be realized in about 1 $F^2$ structure size.

According to another embodiment of the invention, it concerns a magnetic random access memory device, which comprises a plurality of magnetic memory elements as above-described.

According to yet another embodiment of the invention, an easy to perform process for the preparation of a magnetic via in a magnetic memory element as above-described in connection with a split second current line, which may be identified as split write bit lines (WBL1, WBL2), is effected in a self-aligned way, and comprises etching of a trench between said split parts of the second current using said split parts of said second current line as a mask. A second lithographical mask can be used for patterning in the perpendicular direction. Preferably etching is effected until a next metal landing pad is reached. The total height of this trench has to be appropriately adjusted so as to have the desired aspect ratio in the end. Then an insulating layer is deposited, which will isolate the latter magnetic via from both parts of the split second current line. The bottom of the trench then has to be opened through this insulating layer, which for example may be done by a reactive ion etching (RIE) process. Afterwards, the magnetic material is filled into the trench. Then, the whole structure is polished, for example by chemical-mechanical polishing (CMP), down to the top of both parts of the second current line, thus leaving a magnetic via isolated from both parts of the second current line.

According to yet another embodiment of the invention, a process for the preparation of a magnetic memory element comprises the process steps as above-described.

Here, and in accordance with its typical usage, the term "aspect ratio" denotes a ratio of orthogonal dimensions which span the magnetization vector's plane, which in a vertically oriented plane may be identified by a ratio of its height to its width, and, in a horizontally oriented plane may be identified by a ratio of its length to its width. Needless to say, here, and in accordance with its typical usage, the term "vertical" relates to the plane of the wafer surface and thus denotes a direction perpendicularly oriented to the wafer surface, while the term "horizontal" denotes a direction parallelly oriented to the wafer surface.

With the above magnetic memory element 1, in contrast to conventional MRAM-cells where the magnetic storage element and magnetic field sensor 4 both are incorporated in the free layer of one and the same magnetic tunneling junction, it is possible to store information in the magnetic polarization of the magnetic via 1, while the readout is done in a separate magnetic sensor element 4, for example a magnetic tunneling junction. Since the magnetic sensor element 4, which just serves as field sensor, is separated from the magnetic via 1, it can be realized arbitrarily small. Contrary to the magnetic via 1 being vertically oriented, the magnetic sensor element 4 can be horizontally aligned and, thus can be produced with conventional thin layer deposition and patterning technology. The horizontal magnetic sensor element 4 can be made very small and have an aspect ratio of about 1. It, however, can have basically zero magnetic anisotropy to follow the magnetic field arising from the vertical magnetic via 1. Otherwise, as already described above, the aspect ratio and thus the switching field (in the case that shape anisotropy is used) of the vertically aligned magnetic via 1 can be controlled by the depth of the trench to be etched for its realization. Lithographical precision is only needed in one direction perpendicular to the wafer surface.

Thus, the actual magnetic storage element (magnetic via) can be made rather large, in particular with a large enough volume to prevent thermally activated switching. As for the magnetic sensor element 4, being switched by a magnetic stray field, its activation energy is given by the Zeeman energy difference $2HM_SV$, where H is the magnetic stray field from the magnetic via 1 seen by the magnetic sensor element 4, $M_S$ is its saturation magnetization, and V the volume of its free layer. In general, the structure can be optimized as a whole in terms of switching fields and activation energy to the lowest lying erroneous state.

The interaction between adjacent magnetic vias is strongly reduced as all of the magnetic fields point mostly perpendicular to the wafer surface, provided that the magnetic anisotropy is perpendicularly oriented to the wafer surface. As for the magnetic sensor elements, their magnetic moments and thus interaction is very small as they may be realized to have only a small total magnetic moment, due to an aspect ratio near 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetic memory element comprising:
   a magnetic via for storing information made of a magnetic material and being vertically oriented relative to a wafer surface, the magnetic via having a magnetic anisotropy with its magnetization vector being magnetically coupled to at least one current line; and
   a magnetic sensor element for sensing magnetization of the magnetic via comprising at least one magnetic layer having a magnetization vector being magnetically coupled to the magnetization vector of the magnetic via, the magnetic sensor element being conductively connected to the at least one current line.

2. The magnetic memory element of claim 1, wherein the magnetic sensor element is arranged to be spatially distanced from the magnetic via.

3. The magnetic memory element of claim 1, wherein the magnetic sensor element is conductively coupled to a selection device.

4. The magnetic memory element of claim 3, comprising an electrical series connection comprising the at least one current line, the magnetic sensor element, the magnetic via and the selection device.

5. The magnetic memory element of claim 1, wherein the magnetic sensor element is conductively coupled to two current lines, one of which being a bit line and the other one being a word line.

6. The magnetic memory element of claim 5, comprising an electrical series connection comprising the word line, the magnetic sensor element, the magnetic via and the bit line.

7. The magnetic memory element of claim 1, comprising a first current line and a second current line, the second current line being split into two parts, wherein the magnetic via being positioned in between the split two parts of the second current line.

8. The magnetic memory element of claim 7, wherein the split two parts of the second current line being spaced apart from each other to have a distance which is at most equal to a minimum lithographic feature size F.

9. The magnetic memory element of claim 1, wherein the magnetic sensor element is positioned to be horizontally shifted as to the magnetic via.

10. The magnetic memory element of claim 1, wherein the magnetic sensor element is positioned to be in a stacked relationship as to the magnetic via.

11. The magnetic memory element of claim 1, wherein the magnetic anisotropy of the magnetic via is oriented substantially perpendicular relative to the wafer surface.

12. The magnetic memory element of claim 1, wherein the magnetic layer of the magnetic sensor element is substantially parallel relative to the wafer surface.

13. A magnetic memory element comprising:
   a magnetic via for storing information made of a magnetic material and being vertically oriented relative to a wafer surface, the magnetic via having a magnetic anisotropy with its magnetization vector being magnetically coupled to at least one current line; and
   a magnetic sensor element for sensing magnetization of the magnetic via comprising at least one magnetic layer having a magnetization vector being magnetically coupled to the magnetization vector of the magnetic via, the magnetic sensor element being conductively connected to the at least one current line, wherein the magnetic sensor element is a magnetic tunnel junction comprising two magnetic layers of magnetic material stacked in parallel, overlying relationship and separated by a layer of nonmagnetic material.

14. The magnetic memory element of claim 13, wherein magnetization vectors of the magnetic layers of the magnetic tunnel junction are oriented substantially perpendicular to the magnetic layers.

15. The magnetic memory element of claim 13, wherein an aspect ratio of the at least one magnetic layer of the magnetic storage element is larger than 1, and particularly is in the range of from 1.5 to 3.

16. The magnetic memory element of claim 13, wherein an aspect ratio of the magnetic layer of the magnetic sensor element is in the range of from 1 to 2.

17. The magnetic memory element of claim 13, wherein the magnetic memory element is realized in about 8 $F^2$ structure size.

18. The magnetic memory element of claim 13, wherein the magnetic sensor element is realized in about 1 $F^2$ structure size.

19. A magnetic random access memory device comprising:
a plurality of magnetic memory elements, at least one memory element including a magnetic via for storing information made of a magnetic material and being vertically oriented relative to a wafer surface, the magnetic via having a magnetic anisotropy with its magnetization vector being magnetically coupled to at least one current line, and a magnetic sensor element for sensing magnetization of the magnetic via comprising at least one magnetic layer having a magnetization vector being magnetically coupled to the magnetization vector of the magnetic via, the magnetic sensor element being conductively connected to the at least one current line.

20. The memory of claim 19, wherein the magnetic sensor element is arranged to be spatially distanced from the magnetic via.

21. The memory of claim 19, comprising an electrical series connection comprising the at least one current line, the magnetic sensor element, the magnetic via and the selection device.

22. The magnetic memory element of claim 19, comprising a first current line and a second current line, the second current line being split into two parts, wherein the magnetic via being positioned in between the split two parts of the second current line.

* * * * *